US012785034B2

(12) United States Patent
Takaguchi et al.

(10) Patent No.: US 12,785,034 B2
(45) Date of Patent: Nov. 3, 2026

(54) ELECTRON MICROSCOPE

(71) Applicant: HITACHI HIGH-TECH CORPORATION, Tokyo (JP)

(72) Inventors: Katsura Takaguchi, Tokyo (JP); Takashi Ohshima, Tokyo (JP); Hideo Morishita, Tokyo (JP); Yoichi Ose, Tokyo (JP); Junichi Katane, Tokyo (JP); Toshihide Agemura, Tokyo (JP); Michio Hatano, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 326 days.

(21) Appl. No.: 18/572,544

(22) PCT Filed: Aug. 31, 2021

(86) PCT No.: PCT/JP2021/031931
§ 371 (c)(1),
(2) Date: Dec. 20, 2023

(87) PCT Pub. No.: WO2023/032034
PCT Pub. Date: Mar. 9, 2023

(65) Prior Publication Data
US 2024/0128049 A1 Apr. 18, 2024

(51) Int. Cl.
*H01J 37/244* (2006.01)
*H01J 37/26* (2006.01)
*H01J 37/28* (2006.01)

(52) U.S. Cl.
CPC .......... *H01J 37/244* (2013.01); *H01J 37/265* (2013.01); *H01J 37/28* (2013.01)

(58) Field of Classification Search
CPC ........ H01J 37/244; H01J 37/265; H01J 37/28; H01J 2237/0432; H01J 2237/2448; H01J 2237/24485
See application file for complete search history.

(56) References Cited

U.S. PATENT DOCUMENTS

| | | | | |
|---|---|---|---|---|
| 5,041,724 A * | 8/1991 | Feuerbaum | H01J 37/073 | 250/306 |
| 7,030,375 B1 * | 4/2006 | Testoni | H01J 49/446 | 378/34 |

(Continued)

FOREIGN PATENT DOCUMENTS

| | | | | |
|---|---|---|---|---|
| EP | 2390900 A2 * | 11/2011 | H01J 49/422 | |
| JP | 2007263774 A * | 10/2007 | | |

(Continued)

OTHER PUBLICATIONS

Korean Office Action received in corresponding Korean Application No. 10-2023-7044333 dated Jun. 12, 2025.

(Continued)

*Primary Examiner* — David E Smith
(74) *Attorney, Agent, or Firm* — MATTINGLY & MALUR, PC

(57) ABSTRACT

An object of the invention is to provide an electron microscope capable of obtaining a sufficient energy resolution without forming a long drift space and capable of attaining high energy discrimination detection performance with approximately the same device size as in the related art. The electron microscope according to the invention includes a pulsed electron emission mechanism configured to emit an electron beam in a pulsed manner, and discriminates energy of signal electrons by discriminating the signal electrons, which are emitted from a sample by irradiating the sample with the electron beam, according to a time of flight (see FIG. 2).

12 Claims, 15 Drawing Sheets

(56) References Cited

U.S. PATENT DOCUMENTS

| | | | | |
|---|---|---|---|---|
| 8,575,544 | B1 * | 11/2013 | Kelly | H01J 37/244 250/281 |
| 2013/0341527 | A1 | 12/2013 | Berney | |
| 2016/0225583 | A1 * | 8/2016 | Tsuno | H01J 37/244 |
| 2020/0111638 | A1 * | 4/2020 | Araki | H01J 37/243 |

FOREIGN PATENT DOCUMENTS

| | | | |
|---|---|---|---|
| JP | 2014-512069 | A | 5/2014 |
| JP | 2018-137160 | A | 8/2018 |
| KR | 10-2018-0097597 | A | 8/2018 |
| WO | 2017/095908 | A1 | 6/2017 |

OTHER PUBLICATIONS

Hideo Morishita, et al. Resolution improvement of low-voltage scanning electron microscope by bright and monochromatic electron gun using negative electron affinity photocathode, Journal of Applied Physics 127, 164902 (2020); https://doi.org/10.1063/5.0005714.

International Search Report of PCT/JP2021/031931 dated Nov. 16, 2021.

* cited by examiner

ELECTRON MICROSCOPE

TECHNICAL FIELD

The present invention relates to an electron microscope.

BACKGROUND ART

A scanning electron microscope (SEM) is used as a method for observing or analyzing a sample surface with a high spatial resolution. A signal source of an SEM image is signal electrons emitted from a sample when the sample is irradiated with an electron beam. Signal electrons having energy of 50 eV or less are distinguished as secondary electrons (SE), and signal electrons having energy of 50 eV or more are distinguished as backscattered electrons (BSE). When SE is detected, contrast reflecting an uneven shape of the sample surface or a surface voltage is obtained, and when BSE is detected, contrast reflecting a composition or a crystal orientation of the sample is obtained. In this manner, an observation method for obtaining an SEM image in which desired contrast is enhanced by detecting signal electrons in a specific energy band is called energy discrimination detection.

PTL 1 discloses a method in which signal electrons generated by irradiating a sample with a pulsed charged particle beam are guided to a time of flight (TOF) detector out of an optical axis after passing through an objective lens, in which characteristic energy of Auger electrons in an energy band having energy of several 100 eV to several keV is acquired from an energy spectrum of the obtained signal electrons, and in which a composition of the sample is analyzed based on the characteristic energy.

NPL 1 describes an example of an electron beam emission mechanism. NPL 1 describes a photoexcited pulse electron gun using a high-luminance photocathode. In the high-luminance photocathode, an active layer, from which electrons are emitted upon light irradiation, is made of GaAs.

CITATION LIST

Patent Literature

PTL 1: U.S. Pat. No. 7,030,375

Non Patent Literature

NPL 1: Authors including Morishita et al., "Resolution improvement of low-voltage scanning electron microscope by bright and monochromatic electron gun using negative electron affinity photocathode", magazine name of Journal of Applied Physics, Vol. 127, Article No. 164902, 2020.

SUMMARY OF INVENTION

Technical Problem

In general, SE has a peak of generation number with energy of several eV, and high-energy BSE has a broad energy distribution with irradiation energy E0 as maximum energy. When a BSE image is observed, an SEM image including contrast reflecting a difference in composition or a difference in crystal orientation of a sample surface is obtained. The BSE image is obtained by selectively detecting high-energy signal electrons without detecting low-energy signal electrons using an energy filter capable of controlling an intensity of a shielding electric field on a trajectory of the signal electrons. In order to perform discrimination detection on BSE by an SEM, SE having energy of 50 eV or less may be shielded, and sufficient discrimination detection performance is attained by an energy filter having energy resolution of about several 100 eV. On the other hand, when an SE image is observed, an SEM image including contrast reflecting a shape or a potential distribution of the sample surface is obtained. In particular, since SE having energy of 10 eV or less is likely to be affected by a surface voltage distribution, it is expected that an SEM image having enhanced voltage contrast is obtained by controlling an energy band of the detected SE. However, in order to control the detected energy of SE, a high energy resolution of 1 eV or less is necessary, and the necessary energy resolution cannot be obtained in the shielding-electric-field type energy filter.

There is a method of using a deflection-type analyzer as an energy filter having a high energy resolution. The deflection-type analyzer may use a cylindrical surface or a spherical surface, and is used as a filter that sets an appropriate voltage to each of electrodes on inner and outer sides and that limits an energy range of electrons capable of passing through a slit formed at an outlet of the analyzer. By adjusting a slit width, a high energy resolution of 1 eV or less can be attained. On the other hand, the analyzer-type energy filter is controlled such that only electrons in a specific narrow energy range can pass through the slit, and most of charged particles other than these electrons are shielded by the slit. Accordingly, in order to obtain an energy distribution of the signal electrons, it is necessary to sweep and detect a wide energy range for an energy condition under which the signal electrons can pass through the slit. Therefore, when the energy distribution is measured using the deflection-type analyzer, a high energy resolution is obtained, but measurement throughput is a problem.

As an energy discrimination detection method that achieves both a high energy resolution and high measurement throughput, a method for using a time of flight (TOF) until electrons reach a detector from a sample can be exemplified. TOF detection is a detection technique that is practically used in a mass spectrometer. When a detection target is the same type of charged particles flying over the same trajectory, charged particles having higher energy reach the detector in a shorter time, and thus the energy can be identified by measuring the TOF.

In a detection method using the TOF, charged particles in a measurable energy band simultaneously fly to the detector and are simultaneously detected. In the TOF method, unlike the analyzer-type energy filter, it is not necessary to sweep an electrode voltage in order to control energy with which the electrons can pass through the slit. Therefore, when the measurement throughput and sample damage are compared in the same dose amount, the TOF detection method is advantageous. The TOF detection method cannot be applied to a system in which signals are successively detected, and it is important to control a timing for measuring the TOF such that signals or a probe that generates signals is pulsed.

In order to measure an energy spectrum in a wide energy range as in PTL 1, it is necessary to use a beam separator or the like to prevent a deflection direction from being dispersed due to a difference in energy. At this time, in a state in which the signal electrons are accelerated to several keV or more by applying a negative voltage to the sample, it is necessary to deflect the signal electrons to the outside of an axis using the beam separator and perform the TOF detection in a drift space formed outside the axis. In consideration of performance of the detector, a long drift space of about several meters is required in order to perform the TOF detection on electrons accelerated to energy of several keV or more with an energy resolution high enough to identify Auger electrons. Accordingly, a size of an electron microscope is increased.

The invention has been made in view of the above problems, and an object of the invention is to provide an electron microscope capable of obtaining a sufficient energy resolution without forming a long drift space and capable of attaining high energy discrimination detection performance with approximately the same device size as in the related art.

Solution to Problem

An electron microscope according to the invention includes a pulsed electron emission mechanism configured to emit an electron beam in a pulsed manner, and discriminates energy of signal electrons by discriminating the signal electrons, which are emitted from a sample by irradiating the sample with the electron beam, according to a time of flight.

Advantageous Effects of Invention

According to the electron microscope in the invention, a sufficient energy resolution can be obtained without forming a long drift space, and high energy discrimination detection performance can be attained with approximately the same device size as in the related art.

DESCRIPTION OF EMBODIMENTS

Embodiment 1

Figure 1:
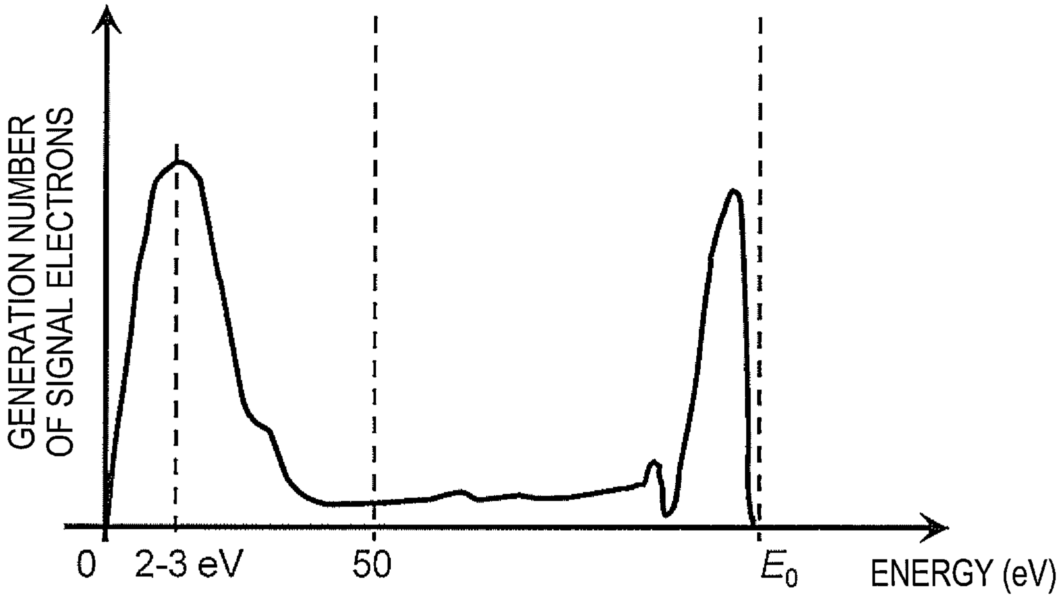
FIG. 1 illustrates an energy distribution of signal electrons emitted when a sample is irradiated with an electron beam having energy E0.

FIG. 1 illustrates an energy distribution of signal electrons emitted when a sample is irradiated with an electron beam having energy E0. SE often has energy of 50 eV or less, particularly 10 eV or less. In an embodiment 1 of the invention, SE having energy of about 10 eV or less is set as a main detection target using an SEM equipped with a pulse electron gun typically capable of generating an electron beam having a short pulse width of about 1 ns or less.

In this case, when a pulse width of a pulse electron beam with which the sample is irradiated can be set to be small, a sufficient energy resolution can be obtained without forming a long drift space, and high energy discrimination detection performance can be attained with approximately the same device size as in the related art. By using this detection method, it is possible to obtain a pure SE image without mixing of BSE signals. Further, peak energy of an SE generation number is detected from an energy spectrum of SE obtained by converting TOF into energy, and a distribution image of a surface voltage of the sample can be acquired based on an energy shift amount of the peak energy. Accordingly, it is possible to provide an SEM image in which voltage contrast of a sample surface including a semiconductor device is enhanced.

Figure 2:
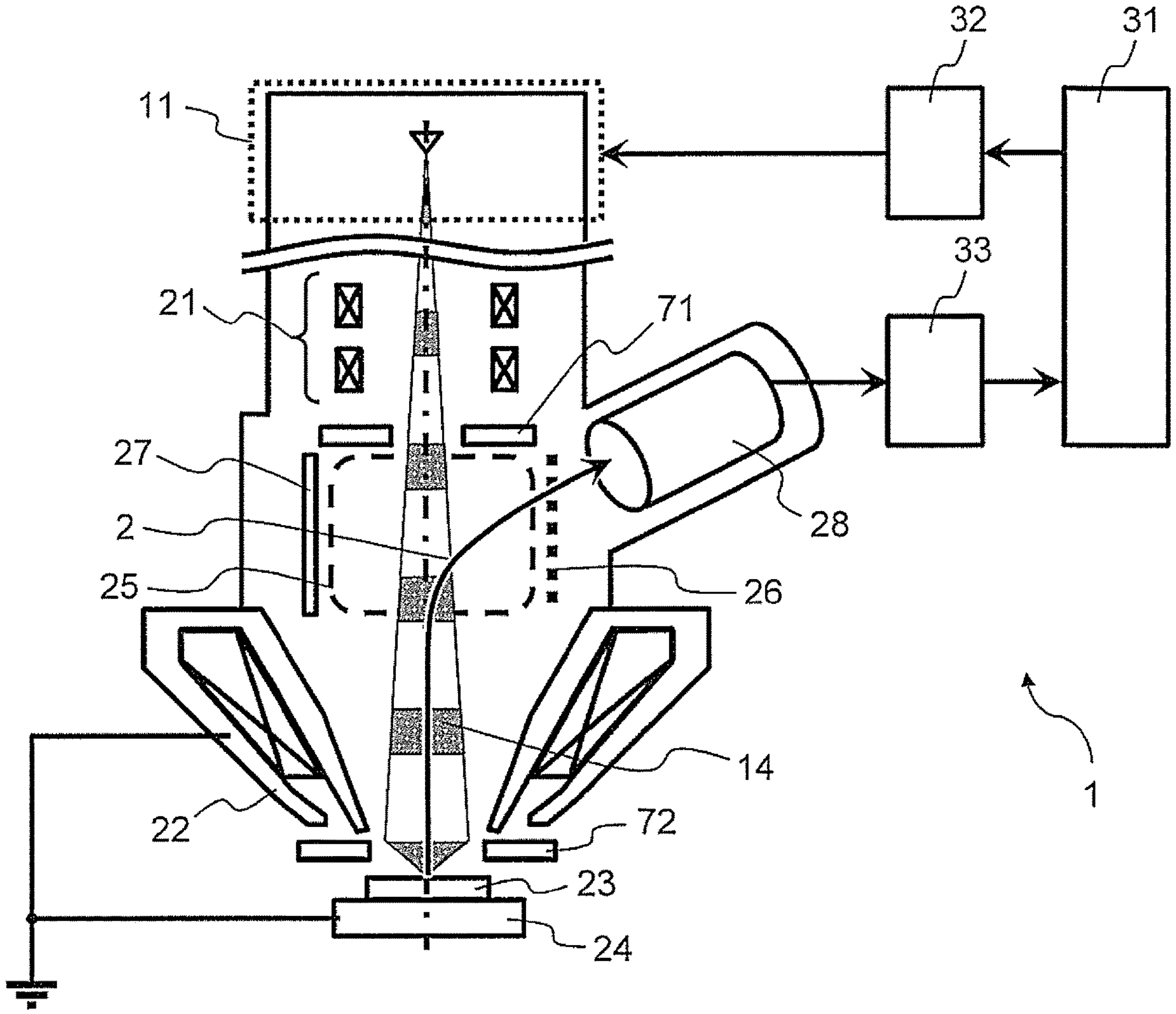
FIG. 2 is a configuration view of an electron microscope 1 according to an embodiment 1.

FIG. 2 is a configuration view of an electron microscope 1 according to the embodiment 1. The electron microscope 1 is implemented as the SEM. The electron microscope 1 includes a pulse electron gun 11 (pulsed electron emission mechanism) that irradiates a sample 23 with a pulsed irradiation electron beam 14, an aperture (not illustrated) that limits a diameter of the irradiation electron beam 14, an electron lens such as a condenser lens or an objective lens 22 that converges the irradiation electron beam 14 on the sample, a deflector 21 that scans the sample with the converged irradiation electron beam 14, a sample stage 24 and a moving mechanism thereof on which the sample 23 is placed and that causes the sample 23 to move to determine an observation region, a beam separator 25 that deflects signal electrons 2 toward a detector out of an optical axis, a detector 28 that detects the signal electrons 2, a control unit 31 (timing control unit), a TOF arithmetic unit 32, an energy spectrum arithmetic unit 33, an SEM image display device (not illustrated), a vacuum exhaust facility (not illustrated), and the like.

The control unit 31 performs timing control of controlling a timing at which irradiation parameters (for example, parameters affecting an irradiation state of the electron beam, such as an irradiation timing from the pulse electron gun 11 and an optical condition) of a pulse electron beam or signal electrons are detected, or calculates the surface voltage of the sample. In addition, the control unit 31 controls each unit provided in the electron microscope 1. Other functional units will be described later.

In an energy discrimination detection system according to the embodiment 1, energy is discriminated using a difference in time of flight (TOF) until the signal electrons 2 generated on the sample reach the detector 28. Since the TOF cannot be measured in a situation in which the signal electrons 2 are successively emitted from the sample 23, in order to generate the signal electrons 2 from the sample 23 by temporal discretization at a constant period, it is necessary to pulse the irradiation electron beam 14, onto the sample 23, serving as a generation source of the signal electrons 2. The pulse electron gun 11 is mounted for this purpose and may be provided in any manner as long as the pulse electron gun 11 is a pulse electron gun having a specification capable of attaining TOF detection to be described later. The pulse electron gun 11 is preferably an electron gun capable of switching and using both a continuous electron beam and a pulse electron beam depending on a purpose in order to switch and use normal SEM observation and TOF measurement.

The pulse electron gun 11 can control an irradiation voltage or an irradiation current to the sample 23, and when the pulse electron gun 11 is used as the pulse electron gun, it is desirable to set conditions such as a desired pulse width or pulse interval. As an example of the pulse electron gun 11, it is possible to apply a pulse electron gun in a manner of combining a high-speed blanking unit, in which various electron guns that emit a continuous electron beam used in an SEM in the related art, such as a cold cathode electric field emission type, a Schottky emission type, and a thermal electron emission type, are used, in which a deflection field applied onto a trajectory of the irradiation electron beam 14 between the pulse electron gun 11 and the sample 23 is controlled at a high speed, and in which a pulse electron beam is generated using a diaphragm placed immediately below. The electron gun applied in this manner can be used as an electron gun for emitting a normal continuous electron beam when used in a blanking-off state, and can be used as a pulse electron gun when used in a blanking-on state. The conditions such as the pulse width or the pulse interval can be set by appropriately controlling blanking.

As another example of the pulse electron gun 11, it is possible to apply a photoexcited pulse electron gun, in which a surface portion of a metal or a semiconductor is irradiated with excitation light having a short pulse width and in which electrons emitted by a photoelectric effect are used as an irradiation electron beam. The electron gun applied in this manner emits a continuous electron beam in a case of irradiation with continuous light as the excitation light, and emits a pulse electron beam in a case of irradiation with pulse light. A pulse light source capable of setting conditions such as the pulse width or the pulse interval necessary for TOF detection is used, so that a pulse electron beam having a corresponding pulse width or pulse interval can be used.

In order to obtain a high spatial resolution in the SEM, it is important to use a high-luminance electron source. The luminance is one of indices of irradiation performance of the electron gun, and is defined by the amount of current emitted per unit area and unit solid angle. When a low-luminance electron source is used, a minimum spot diameter on the sample is limited by a spot diameter on the sample caused by a light source diameter of the electron gun. In order to implement a TOF detection system that achieves both a high spatial resolution and a high energy resolution, it is important to use an electron gun having high luminance and a short pulse.

Figure 3:
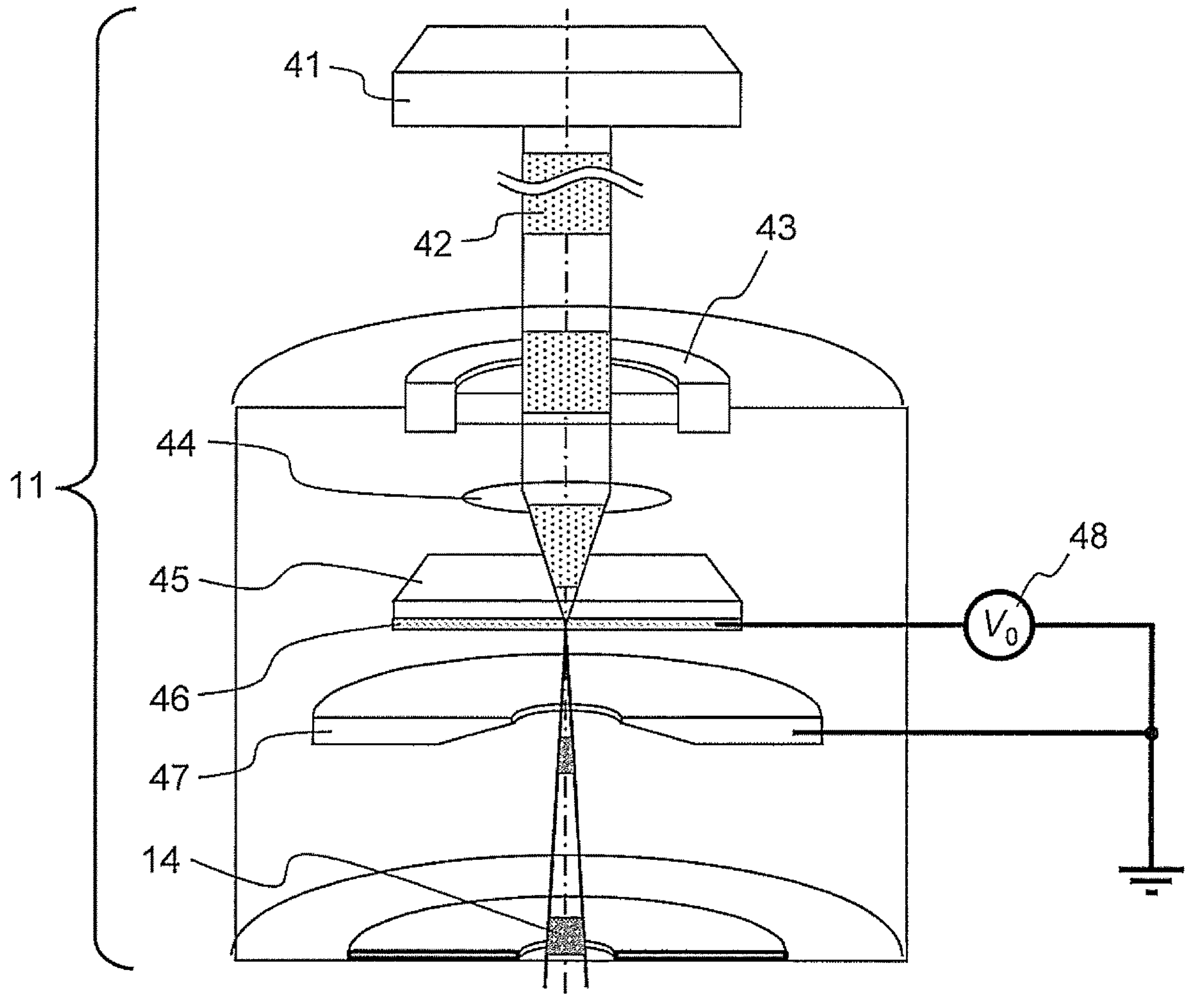
FIG. 3 is a configuration view of a photoexcited pulse electron gun described in NPL 1.

FIG. 3 is a configuration view of a photoexcited pulse electron gun described in NPL 1. The pulse electron gun can be used as the pulse electron gun 11 in the embodiment 1. The pulse electron gun can emit the pulse electron beam having high luminance and a short pulse width, and has favorable irradiation performance for an electron beam application apparatus according to the invention.

A photocathode includes a substrate 45 and an active layer 46. A surface of the photocathode is in a state of negative electron affinity (NEA) through activation treatment, and a vacuum level is lower than an energy level at a lower end of an internal conduction band. When the photocathode is irradiated with the excitation light under this condition, electrons excited from a valence band to the conduction band are efficiently emitted to the outside of the photocathode. In order to use the photocathode having such an NEA surface as a high-luminance electron source, it is important to dispose an optical lens 44 on a back side of the photocathode in which the active layer 46 is formed on the transparent substrate 45. By collecting excitation light 42 with a large numerical aperture on the active layer 46, a light collection diameter of the excitation light can be about 1 μm, and a high-luminance pulse electron gun having approximately the same peak luminance as a Schottky electron gun can be obtained.

A pulse width of the irradiation electron beam 14, which is emitted by irradiating the photocathode provided in a vacuum-exhausted electron gun chamber with the pulsed excitation light 42 via a viewport 43 using a pulse light source 41 provided in an atmospheric area, can reach <<1 ns. An extraction electrode 47 is provided immediately below the photocathode, an acceleration electric field is formed between a cathode and the extraction electrode 47 when a cathode voltage 48 is applied, and the electron beam emitted from the photocathode is converged while being accelerated toward the sample.

The electron gun using the high-luminance NEA photocathode has an energy width with good monochromaticity and has an energy width smaller than that of a cold cathode electron gun. When an electron gun having good monochromaticity is mounted on the SEM, it is advantageous in that chromatic aberration that limits the spatial resolution can be reduced in low acceleration observation. Therefore, by combining the pulse electron gun using the high-luminance NEA photocathode and the TOF detection system according to the invention, it is expected that a potential distribution of the sample surface can be measured with a high spatial resolution under a low acceleration condition of the SEM and a high energy resolution can be obtained.

The objective lens 22 according to the embodiment 1 is a semi-in-lens type or an in-lens type objective lens that leaks a lens magnetic field to the sample. Since a lens field is formed in the vicinity of the sample and lens aberration such as spherical aberration or chromatic aberration can be reduced, the sample can be observed with a high spatial resolution. In the embodiment 1, a semi-in-lens type objective lens is described, but the same also applies to a part related to the TOF detection when any type of objective lens is used. As compared with the semi-in-lens type, the in-lens type has a limitation on a sample size that can be observed. However, the in-lens type is superior in resolution because of a shorter focal length. Since the semi-in-lens type does not spatially restrict a lower portion of the objective lens, a sample having a relatively large size can be observed with a high spatial resolution.

The irradiation electron beam 14 emitted from the pulse electron gun 11 is converged on the sample 23 by the objective lens 22. When the semi-in-lens objective lens 22 is used, SE2 generated on the sample passes through the objective lens 22 while being converged by the lens magnetic field. SE is deflected out of the optical axis by the beam separator 25 mounted on a pulse electron source side with respect to the objective lens, and is guided toward the detector 28. Accordingly, SE can be efficiently detected by the detector 28.

As an example of the beam separator 25, a Wien filter can be applied in which an electric-field deflection field and a magnetic-field deflection field are applied in directions orthogonal to each other. Another beam separator may be applied in which three or more stages of electric-field deflection fields or magnetic-field deflection fields are arranged along the optical axis on the trajectory of the irradiation electron beam. FIG. 2 illustrates an example in which the Wien filter is mounted as the beam separator 25. A deflection electrode 26 disposed on a detector side of the Wien filter has a mesh shape, and the SE, which is off-axis deflected by the Wien filter and passes through the deflection electrode 26, is detected by the detector 28 provided out of the optical axis. A time required for SE to reach a sensing surface of the detector 28 from the sample 23 is the time of flight (TOF) of this detection system.

Figure 4:
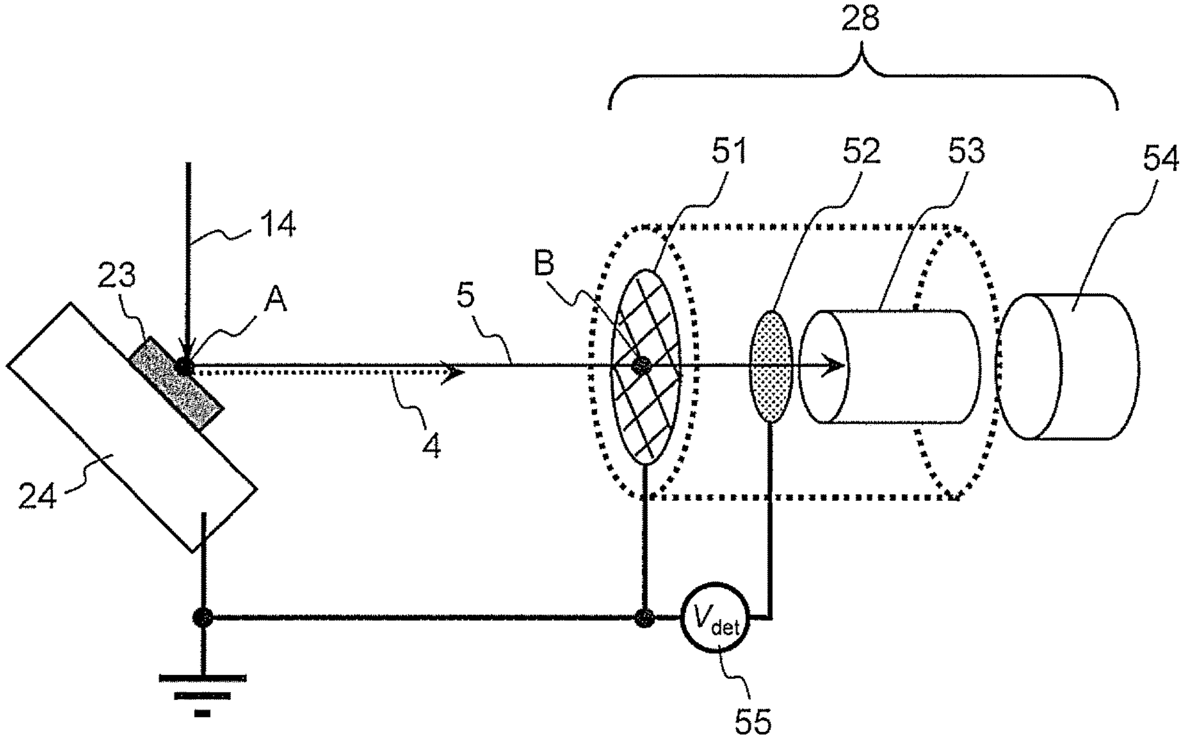
FIG. 4 is a detailed configuration view of a detector 28.

FIG. 4 is a detailed configuration view of the detector 28. The detector 28 includes a scintillator 52 obtained by metal vapor deposition on a surface thereof, a light guide 53, and a photomultiplier tube 54, and a detector generally known as an Everhart & Thornley (ET) type is used. In a normal SEM, a positive voltage of about 10 kV is applied to the sensing surface of the detector. Accordingly, SE is captured by the detector, and is accelerated to have energy of 10 keV or more and to collide with the scintillator 52, so that a sufficient light amount is emitted from the scintillator 52 and can be detected by the photomultiplier tube 54. Accordingly, sufficient detection sensitivity can be obtained for low-energy SE. In FIG. 4, a case is described in which the ET-type detector using the scintillator is applied to the sensing surface, but a configuration of the detector is not limited thereto. In addition, with a configuration in which a positive voltage is applied to a sensing surface of a semiconductor detector, an avalanche photodiode (APD), a multi-channel plate (MCP), or the like to detect the accelerated SE, the same detection performance can be attained.

Although details will be described later using formulas, when an acceleration electric field for SE is distributed from the sample 23 to the detector 28, a difference in TOF is less likely to be generated due to a difference in energy of SE. Therefore, the detector 28 for the TOF detection is preferably implemented such that SE is not accelerated until immediately reaching the sensing surface of the detector as illustrated in FIG. 4. That is, it is preferable that a flight space of the signal electrons 2 between the sample 23 and the detector 28 is a space close to equipotential. Therefore, a mesh-shaped guard electrode 51 having the same potential as the sample 23 or the objective lens 22 is disposed in front of the detector 28, and the ET-type detector having the same normal configuration is disposed behind the guard electrode 51. In the configuration in FIG. 4, when a positive voltage of about +10 kV is applied to the sensing surface of the detector, the signal electrons 2 passing through the guard electrode 51 are accelerated and detected by the ET detector.

Figure 5:
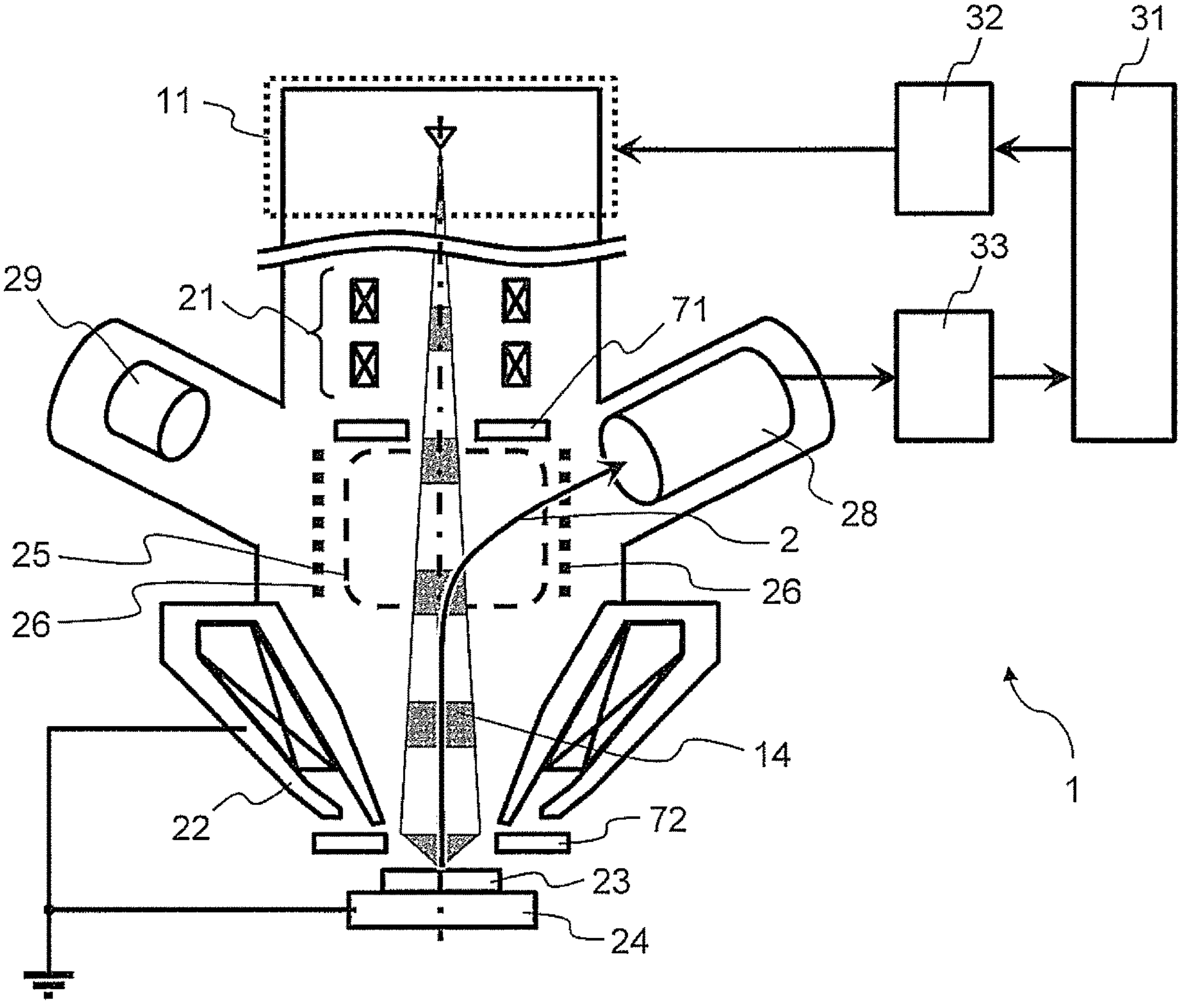
FIG. 5 illustrates another configuration example of the electron microscope 1.

FIG. 5 illustrates another configuration example of the electron microscope 1. In order to enable normal detection and the TOF measurement to be switched and used, as illustrated in FIG. 5, a detector 29 for normal detection and the detector 28 for the TOF detection may be disposed on both sides of the beam separator 25. Accordingly, it is possible to observe an SEM image normally detected by a continuous electron beam when searching for a field of view, and to perform the TOF detection when measuring an energy spectrum of SE or a distribution image of the energy spectrum.

Mesh electrodes are formed on both sides of the deflection electrode 26, and a deflection direction of SE can be controlled by forming an electromagnetic pole such that a direction of an electromagnetic-field deflection field can be reversed. The guard electrode 51 is not disposed in the detector for normal detection, and a capturing electric field is distributed in the vicinity of the sensing surface of the detector, so that SE flying to the vicinity of the detector can be accelerated and detected. SE normally deflected toward the detector by the beam separator 25 distributes an electric field in a manner of being accelerated after passing through the mesh-shaped deflection electrode 26.

A method for calculating energy of signal electrons by the TOF detection will be described in detail with reference to FIG. 4. A case is considered in which the signal electrons 2 generated in the sample 23 (point A, s=0) move forward to the detector 28 (point B, s=L). A potential on a path AB is set to V(s)[V] and a potential of the sample is set to $V(0)=V_0$[V]. When the energy conservation law is applied, energy at any position s on the path AB of the signal electrons 2 emitted at the energy $E_0$ from the sample is $E(s)=E_0+e[V(s)-V_0]$. Here, e is an elementary charge of electrons, and $e=1.6\times10^{-19}$ [C]. Based on a calculation formula $ds/dt=\sqrt{[2E(s)/m]}$ of a speed of electrons having the energy E(s), a time of flight (TOF) $T_{tof}$[s] of the electrons moving on the path AB can be calculated by the following Formula 1, assuming that a mass m of electrons=$9.1\times10^{-31}$ [kg].

[Formula 1]

$$T_{tof} = \int_0^L ds\sqrt{\frac{m}{2E(s)}} = \int_0^L ds\sqrt{\frac{m}{2[E_0 + e(V(s) - V_0)]}} \quad (1)$$

Since $T_{tof}$ decreases as the energy E(s) of the electrons increases, the energy of the signal electrons can be identified by a difference in $T_{tof}$. Since $V(s)=V_0$ when a space above the path AB is an equipotential space, Formula 1 can be transformed into Formula 2 below.

[Formula 2]

$$T_{tof} = L\sqrt{\frac{m}{2E_0}} \quad (2)$$

Figure 6:
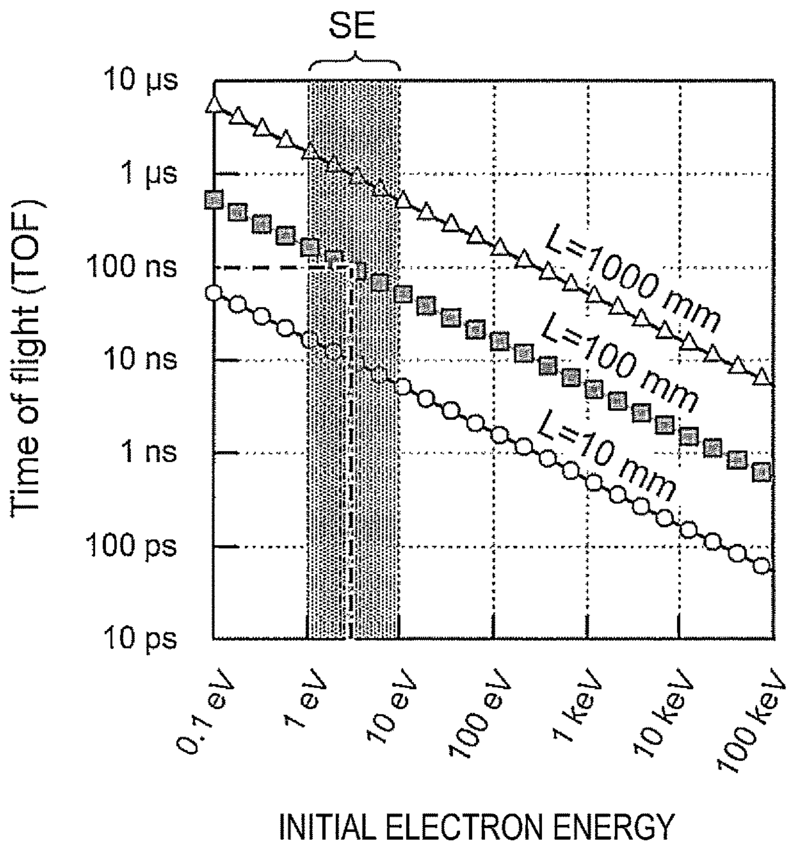
FIG. 6 illustrates a calculation result of $T_{tof}$ of signal electrons having energy $E_0$=0.1 eV to 1 keV for L=10 mm, 100 mm, and 1000 mm when a space from a sample 23 to the detector 28 is equipotential.

As one example, FIG. 6 illustrates a calculation result of $T_{tof}$ of signal electrons having energy $E_0$=0.1 eV to 1 keV for L=10 mm, 100 mm, and 1000 mm when a space from the sample 23 to the detector 28 is equipotential. As an example, when SE is set as a main detection target at a flight distance L=100 mm, the TOF for the electrons having energy $E_0$=several eV is about 100 ns. Since a periodic signal can be detected with a temporal resolution of about 1 ns, a sufficient energy resolution can be obtained for SE having energy of about several eV.

When the space from the sample 23 to the detector 28 is not equipotential, the signal electrons 2 are accelerated or decelerated. In particular, in a region in which electrons are accelerated, a time difference in TOF is small. In an embodiment 3, a detection method will be described when the TOF detection is performed with a device configuration, in which a retarding method for applying a negative voltage to the sample 23 or a boosting method for applying a positive voltage to a space from the electron gun to the front of the sample is applied and the signal electrons 2 emitted from the sample 23 are accelerated in the space until reaching the detector 28.

Figure 7:
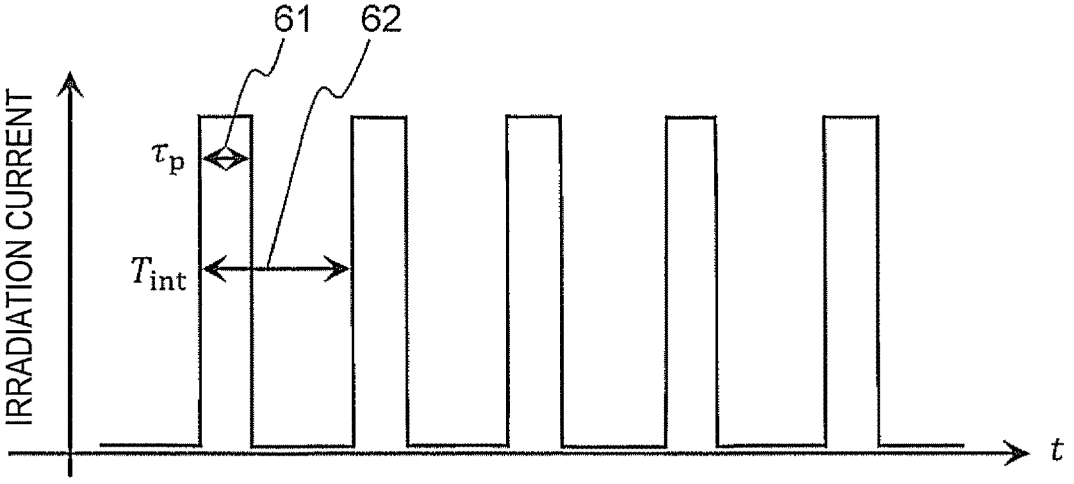
FIG. 7 illustrates an example of a pulse waveform of an electron beam emitted from a pulse electron gun 11.

FIG. 7 illustrates an example of a pulse waveform of an electron beam emitted from the pulse electron gun 11. A pulse width 61 and a pulse interval 62 are defined based on the pulse waveform, and the sample is periodically irradiated with an electron beam having the same pulse width ($\tau_p$) and the same pulse interval ($T_{int}$). A pulse frequency is a reciprocal of the pulse interval and represents the number of pulses of the electron beam with which the sample is irradiated per unit time. When the sample 23 is irradiated with the pulse electron beam, the generated signal electrons also serve as temporally discrete signals.

Conditions related to the pulse width of the pulse electron beam, which are necessary for the TOF detection performed by the SEM, will be described. When the pulse width is set to be larger than the TOF corresponding to the energy of the electrons serving as a target of energy discrimination detection, SE emitted by irradiation with a head portion of the pulse electron beam and SE emitted by irradiation with the rearmost tail portion of the pulse electron beam have the same TOF at a time of detection regardless of being SE having different energy at a time of generation. For example, when Formula 1 is used in the case of L=100 mm, the TOF of electrons having energy of 1 eV is 170 ns, and the TOF of electrons having energy of 100 eV is 17 ns. When the pulse width of the pulse electron beam is set to 153 ns, electrons of 1 eV emitted by the pulse electron beam at the head portion and electrons of 100 eV emitted by the pulse electron beam at the rearmost tail portion reach the detector at the same timing. In this manner, it can be seen that when the pulse width is set to be significantly larger than the TOF corresponding to the energy of electrons serving as the target, the energy resolution of the TOF detection system decreases. Therefore, the smaller the pulse width of the pulse electron beam, the more preferable. In the embodiment 1, in order to obtain a high energy resolution for SE of about 10 eV or less serving as a target of energy discrimination detection, it is desirable to set the pulse width to 1 ns or less.

Conditions related to the pulse interval of the pulse electron beam and necessary for the TOF detection performed by the SEM will be described. When the pulse interval is small, before signal electrons having the lowest energy and generated when a first pulse electron beam is emitted are detected, signal electrons generated when a second pulse electron beam is emitted are detected, and a necessary energy spectrum cannot be obtained. In order to avoid this situation, the pulse interval of the pulse electron beam may be set to be larger than the TOF corresponding to the lowest energy of the detection target. For example, when the lowest energy of SE to be detected at L=100 mm is set to 0.1 eV, TOF corresponding to energy of 0.1 eV is 533 ns, and thus the pulse interval may be set to 1 μs (pulse frequency of 1 MHz).

As described above, when L=100 mm in the equipotential space from the sample to the detector, in order to perform energy discrimination detection on SE having energy of about 1 eV, it is preferable to set the pulse width to about 1 ns and the pulse interval to about 1 μs (pulse frequency of 1 MHz). The flight distance of L=100 mm is approximately the same as dimensions of a detector mounted on the SEM in the related art, and is a size of a mountable detector without requiring a significant change in configuration.

A method for controlling a timing at which the sample is irradiated with the pulse electron beam or a timing at which the signal electrons 2 are detected will be described in detail below. In order to measure the energy of the signal electrons 2 based on the TOF, it is important to accurately set a time reference for calculating a TOF for each pulse. As an example of a timing control method, based on a timing at which the sample 23 is irradiated with the irradiation electron beam 14 or a timing at which the signal electrons 2 emitted from the sample 23 reach the detector 28, a method for setting a timing to start detecting signals corresponding to the pulses is considered.

Figure 8:
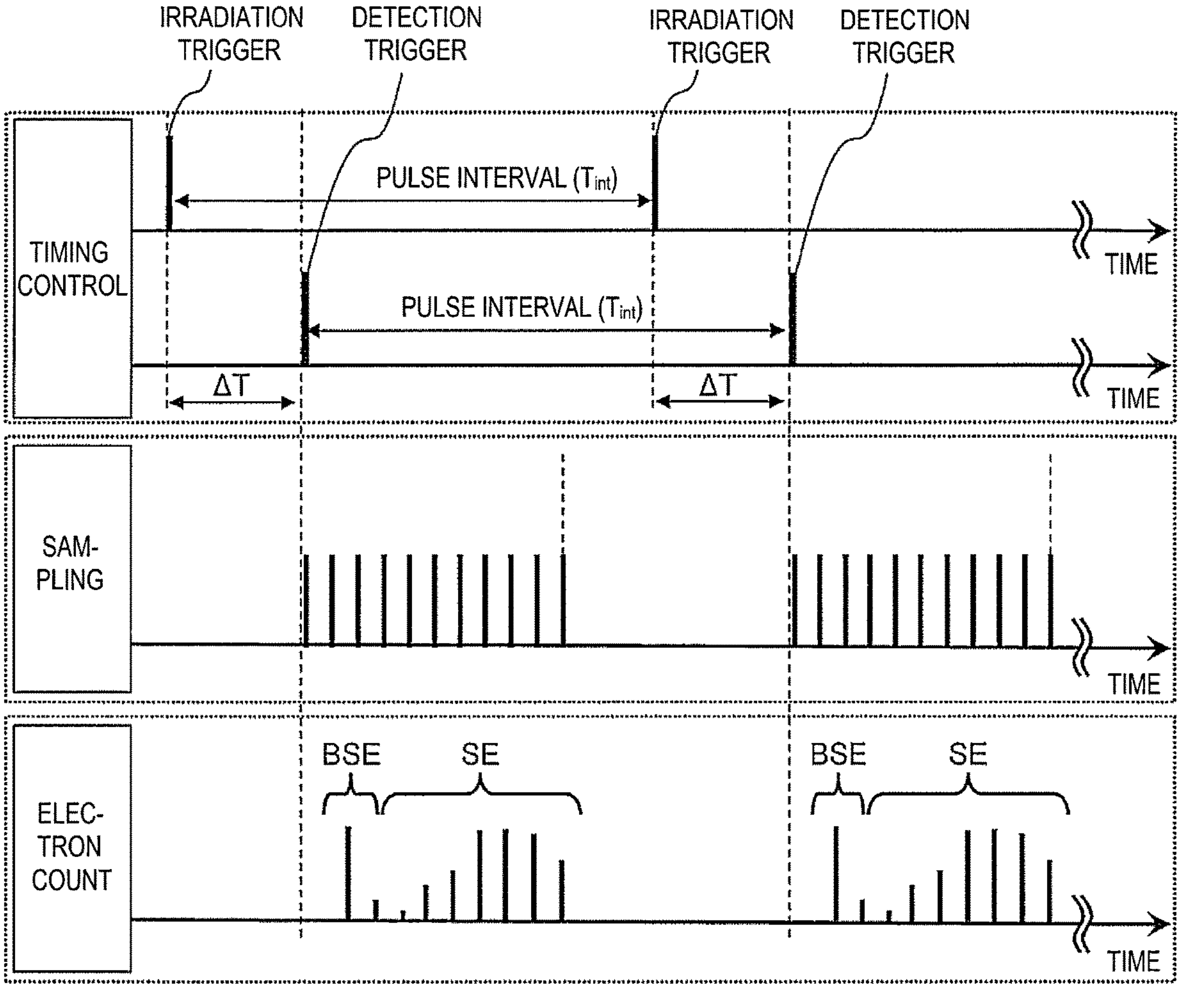
FIG. 8 illustrates a time chart of internal triggers, such as a timing at which the sample 23 is irradiated with an irradiation electron beam 14 and a timing at which signal electrons 2 are detected by the detector 28.

FIG. 8 illustrates a time chart of internal triggers, such as a timing at which the sample 23 is irradiated with the irradiation electron beam 14 and a timing at which the signal electrons 2 are detected by the detector 28. A time interval between the first pulse electron beam and the second pulse electron beam is equal to the pulse interval ($T_{int}$) of the irradiation electron beam. When this method is applied, the TOF is calculated based on a time difference ΔT between a timing of generating an irradiation trigger in which pulses of the irradiation electron beam are generated by the pulse electron gun 11 and a timing of generating a detection trigger in which the signal electrons are detected by the detector 28. ΔT is set in consideration of a length of a connection cable between the control unit 31 and the pulse electron gun 11, a time until the pulse light emitted from the pulse electron gun 11 reaches the photocathode, a time until the pulse electron beam emitted from the photocathode reaches the sample, a time until the signal electrons generated on the sample reach the detector 28, a length of a connection cable between the detector 28 and the control unit 31, and the like.

According to FIG. 8, the control unit 31 controls each timing as follows: (a) controls a sampling timing (detection trigger) of the detector 28 such that a detection signal starts to be sampled at a timing after the time (ΔT) required for the signal electrons 2 to reach the detector 28 from emission of the irradiation electron beam 14 by the pulse electron gun 11; and (b) controls a sampling timing (detection trigger) of the detector 28 such that sampling of the signal electrons generated by a first irradiation electron beam 14 is completed (such that a first sampling in FIG. 8 is completed before a second irradiation trigger) in a period from emission of the first irradiation electron beam 14 (for example, a first irradiation trigger in FIG. 8) by the pulse electron gun 11 to emission of a second irradiation electron beam 14 (for example, the second irradiation trigger in FIG. 8) by the pulse electron gun 11.

Figure 9:
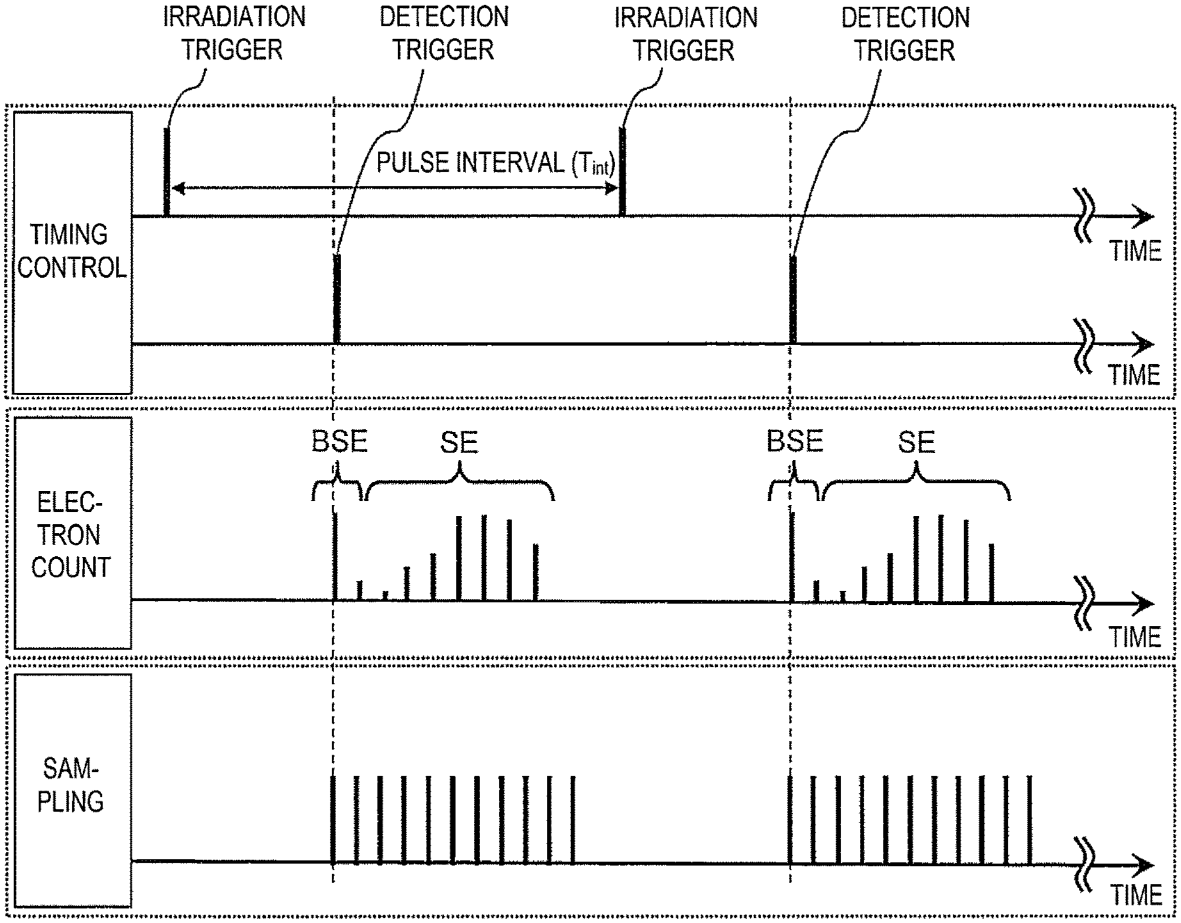
FIG. 9 illustrates another time chart of internal triggers, such as a timing at which the sample 23 is irradiated with the irradiation electron beam 14 and a timing at which the signal electrons 2 are detected by the detector 28.

FIG. 9 illustrates another time chart of internal triggers, such as a timing at which the sample 23 is irradiated with the irradiation electron beam 14 and a timing at which the signal electrons 2 are detected by the detector 28. As a timing control method different from that in FIG. 8, a control method with reference to a timing at which BSE having approximately the same energy as the irradiation electron beam is detected is considered. When BSE is used with reference to the timing at which the signal electrons are detected, it is not necessary to consider a delay time of the system, and thus it is expected that energy of SE can be measured more accurately. Depending on measurement conditions, a case is also assumed in which BSE having energy approximately the same as the irradiation energy is not necessarily detected. However, when an appropriate sampling time is set for the low-energy SE, an error in the calculated energy due to a fact that the BSE having the assumed energy is not detected is sufficiently small.

The detection method with reference to the timing at which the BSE is detected can be effectively used even under a condition under which a working distance (WD) of the sample changes variously. For example, a case is considered in which the WD is set to a WD having a length of about 15 mm for an analysis based on an observation condition at a WD of several mm. When the BSE is not used, it is necessary to detect energy of the detected signal electrons in consideration of a change in TOF in association with a change in WD. On the other hand, when the BSE is used, there are advantages that an algorithm for energy conversion of TOF does not depend on WD and that an error in energy calculation can be reduced.

According to FIG. 9, the control unit 31 controls each timing as follows: controls the detection trigger such that, after the pulse electron gun 11 emits the irradiation electron beam (after the irradiation trigger), the detector 28 starts sampling from a time point at which the detector 28 initially detects the signal electrons (BSE).

In the configuration according to the embodiment 1 using the semi-in-lens type or in-lens type objective lens 22, since a BSE detection rate by the detector provided for the TOF detection is small, it is preferable that a detector 71 and a detector 72 capable of efficiently detecting BSE having approximately the same energy as the irradiation electron beam are provided in a space on an electron source side of the energy separator or a space on a sample side with respect to the objective lens, the timing of the TOF detector is controlled in a manner of being synchronized with the timing at which the BSE is detected, and the TOF of the detected signal electrons is calculated. In this case, a detection signal of the detector 71 or the detector 72 is used as the detection trigger of the control unit 31. The detector 72 may be any detector having sensitivity to BSE, such as an ET-type detector using a scintillator, in addition to a semiconductor detector, an APD, and an MCP.

Figure 10:
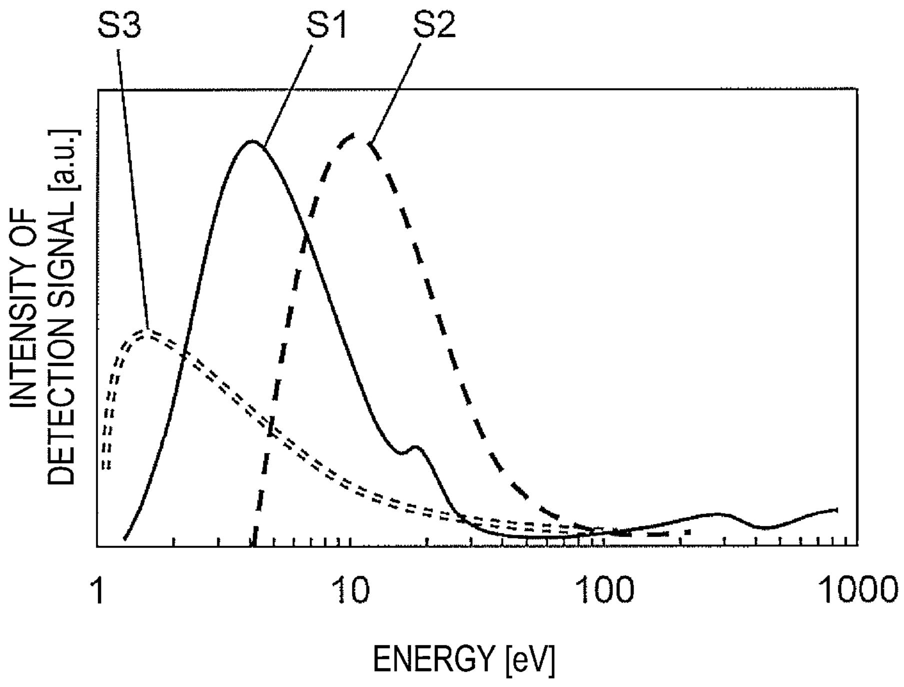
FIG. 10 is an energy distribution diagram illustrating a method for measuring a potential distribution of a sample surface.

FIG. 10 is an energy distribution diagram illustrating a method for measuring a potential distribution of the sample surface. According to the above steps, energy is calculated based on the TOF of the detected signal electrons, and an energy spectrum of SE can be obtained. When the sample surface is not charged (that is, when a charging amount is equal to or less than a reference value), a peak (S1) of SE generation number is observed in the vicinity of energy $E_{peak}$=2 eV to 3 eV. In contrast, when the sample surface is charged, the peak energy $E_{peak}$ shifts depending on a charge polarity or the charging amount of the sample. When the sample surface is negatively charged, a peak (S2) is observed on a high-energy side, and when the sample surface is positively charged, a peak (S3) is observed on a low-energy side. The control unit 31 (arithmetic unit) calculates the peak energy of SE based on the energy spectrum obtained by the TOF detection, and calculates the surface voltage based on a peak shift amount. The surface voltage estimated by this method is calculated for each pixel of the SEM and is displayed as a mapping image, so that a distribution image of the surface voltage is obtained.

Figure 11A:
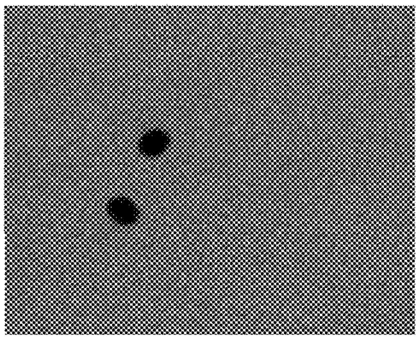
FIG. 11A illustrates an example of a normal SEM image (surface shape image).
Figure 11B:
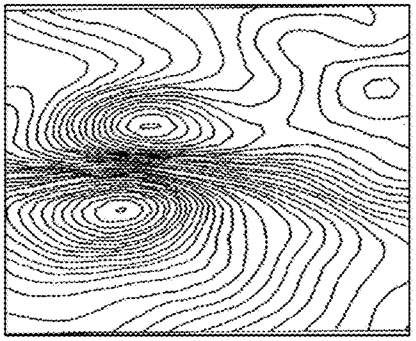
FIG. 11B illustrates an example of equipotential lines.
Figure 11C:
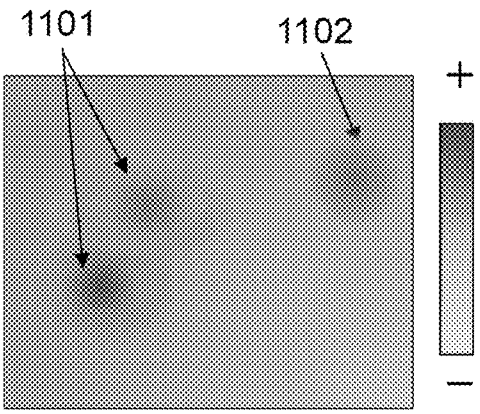
FIG. 11C illustrates an example of a potential mapping image.

FIGS. 11A to 11C illustrate examples of a display screen when a potential distribution image is acquired using the above method. FIG. 11A is an example of a normal SEM image (surface shape image), FIG. 11B is an example of equipotential lines, and FIG. 11C is an example of a potential mapping image. By using this analysis method, impurities 1101 and a defect 1102 on a sample surface of a semiconductor device can be analyzed.

Figure 13:
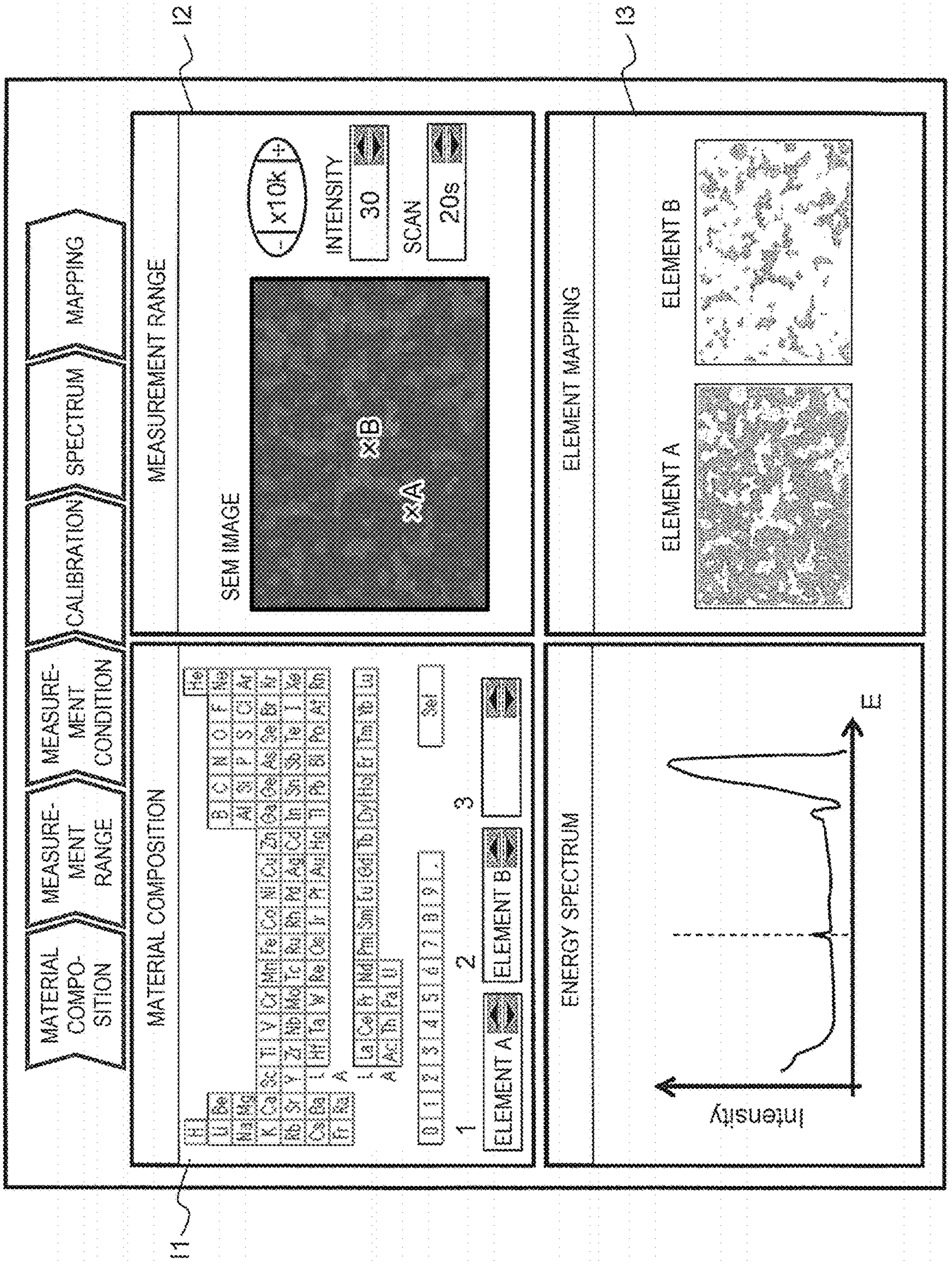
FIG. 13 illustrates an example of a user interface provided in the electron microscope 1 according to the embodiment 2.

The control unit 31 may present a surface voltage distribution as illustrated in FIGS. 11A to 11C on a user interface. The user interface can be implemented as, for example, a graphical user interface (GUI) on a screen as illustrated in FIG. 13 to be described later.

A maximum value of the number of electrons per pulse of the irradiation electron beam 14 depends on the luminance of the pulse electron gun. Depending on a situation that the sample surface is charged, a case may also be considered in which, in order to reduce the number of electrons per pulse and sufficiently provide a time for relaxing the electrons contributing to charging, a preferable potential distribution image can be obtained by performing observation with an increased pulse interval. In consideration of such a situation, control may be performed to synchronize the pulse electron gun and scanning signals of the SEM such that each pixel is irradiated with a plurality of electron beam pulses, and to integrate TOF detection signals and acquire the energy spectrum of SE.

Control of applying a voltage to the sample for the purpose of controlling an influence of charging on the sample surface may be performed. When the number of electrons with which the sample is irradiated is $N_{in}$ and the number of signal electrons emitted from the sample is $N_{out}$, a yield η of the signal electrons is defined as $\eta=N_{out}/N_{in}$. The yield η depends on the irradiation energy. A condition that the yield η is 1 is present in the vicinity of the irradiation energy of 1 keV. When the irradiation energy is larger than 1 keV, $\eta<1$ and the sample surface is negatively charged, and when the irradiation energy is less than 1 keV, $\eta>1$ and the surface is positively charged. By utilizing this phenomenon, a charged state of the sample surface can be controlled.

Conclusion of Embodiment 1

The electron microscope 1 according to the embodiment 1 includes the pulse electron gun 11 that emits a pulsed electron beam, and discriminates energy of the signal electrons according to the time of flight of the signal electrons emitted from the sample. The pulse electron gun 11 emits the electron beam with a pulse width of 1 ns or less. Accordingly, energy discrimination can be accurately performed on SE having energy of about 10 eV or less.

The electron microscope 1 according to the embodiment 1 calculates the surface voltage of the sample by comparing an energy spectrum of the signal electrons detected by the detector 28 with an energy spectrum of the signal electrons when the charging amount of the sample is equal to or less than the reference value. Accordingly, a potential distribution image of the sample surface can be obtained using SE having energy of about 10 eV or less.

Embodiment 2

Figure 12:
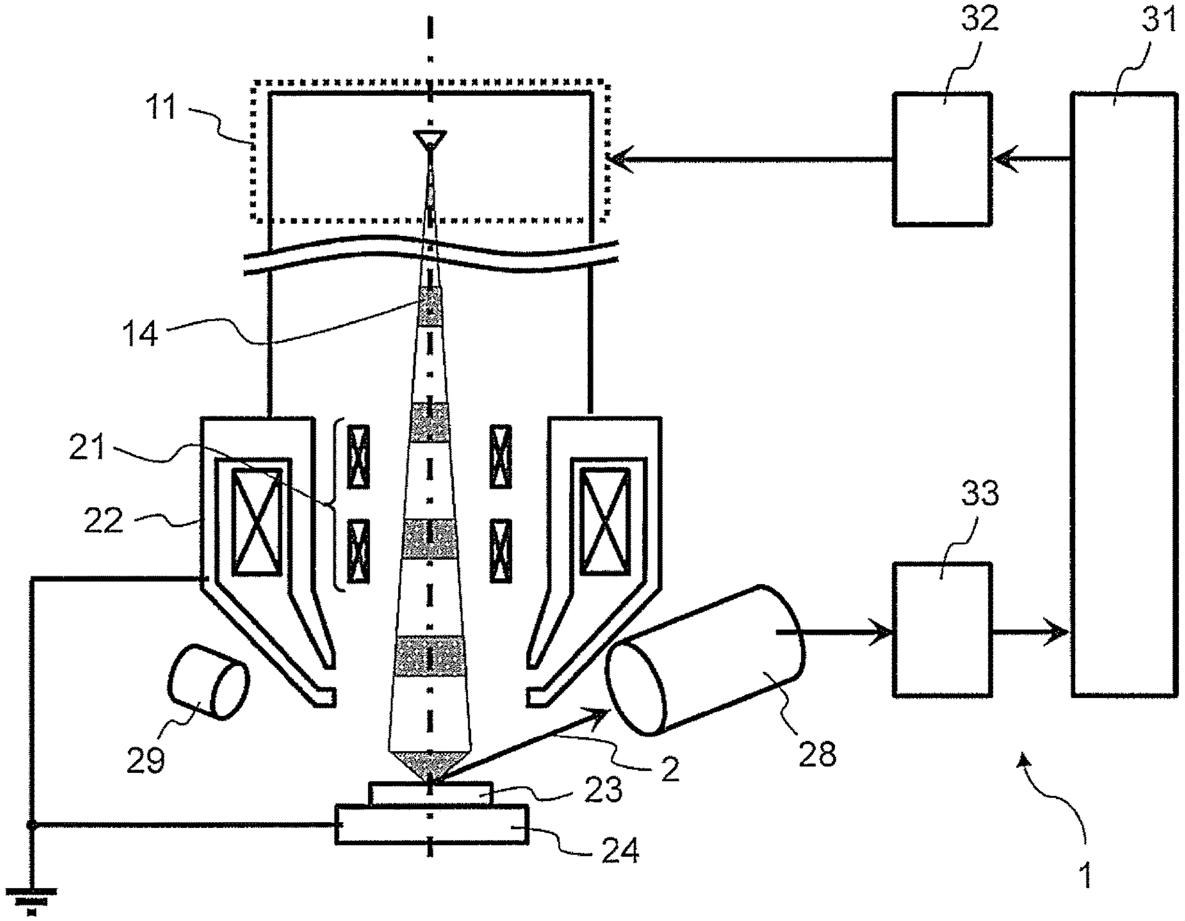
FIG. 12 is a configuration view of the electron microscope 1 according to an embodiment 2.

FIG. 12 is a configuration view of the electron microscope 1 according to an embodiment 2 of the invention. In the embodiment 2, different from the embodiment 1, the beam separator 25 is not mounted, and TOF detection is performed on signal electrons linearly reaching a detector from a sample. Configurations of the pulse electron gun 11 and the detector 28 are the same as those in the embodiment 1. A configuration different from the embodiment 1 will be described in detail below.

As in the embodiment 1, when the detector 29 and the detector 28 for normal detection are separately disposed and the normal detection and the TOF detection can be switched and used depending on a purpose, an SEM image normally detected with a continuous electron beam can be observed when searching for a field of view, and the TOF detection can be performed when an energy analysis is necessary.

The objective lens 22 in the embodiment 2 is an out-lens type objective lens that does not leak a magnetic field to the sample. Different from the semi-in-lens type according to the embodiment 1, since the out-lens type objective lens does not distribute a lens magnetic field in the vicinity of the sample, the signal electrons emitted from the sample fly while maintaining an initial angle at a time of generation. Since there is no potential difference between the sample 23 and the detector 28 and the disposition is the same as that in FIG. 4, a flight distance L substantially coincides with a distance between the sample 23 and the guard electrode 51 at a tip end portion of the detector 28.

In the embodiment 1, since SE converged by a leakage magnetic field of the objective lens 22 is detected, most of SE is captured by the detector 28. In contrast, a signal detection amount of the signal electrons detected in the embodiment 2 is limited by a solid angle of a sensing surface of the detector that the sample 23 faces. Therefore, by forming the objective lens 22 in a conical shape and disposing a detector having a large sensing surface, it is possible to increase the solid angle for detecting the signal electrons on which the TOF detection can be performed. In addition, a plurality of detectors 28 may be mounted around the conical objective lens 22, and control may be performed such that signals detected by the detectors after being synchronized and integrated are output.

In the Embodiment 1, the beam separator 25 is used, which is preferable for the TOF detection limited to low-energy SE having energy of 50 eV or less, but is not suitable for the TOF detection on high-energy signal electrons of several keV or more under the same condition. In contrast, in the second embodiment, since the beam separator 25 is unnecessary, the TOF detection can be performed on the signal electrons in a wide energy range. Accordingly, it is possible to perform energy spectroscopy detection on Auger electrons using the TOF detection.

The Auger electrons are electrons emitted by energy, which is released when inner shell electrons are scattered accompanied by electron beam irradiation to generate an empty level and outer shell electrons transition to this empty level. The Auger electrons have energy corresponding to an energy difference between an inner-shell level and an outer-shell level. Since the energy of the Auger electrons is unique to elements, a constituent element at an electron beam irradiation position on the sample can be specified by preparing a data table for describing a correspondence relationship between an energy peak of the Auger electrons and the element, detecting a peak on an energy spectrum of the signal electrons obtained by the TOF detection, and referring to the data table. When this is performed on each pixel, a distribution image of an elemental analysis can be obtained.

The TOF arithmetic unit 32 can specify an element at a position at which the sample is irradiated with an electron beam using the TOF of the Auger electrons or the peak on the energy spectrum according to the above principles.

Since the Auger electrons are emitted from the outermost sample surface, it is necessary to clean the sample surface in advance when the Auger electrons are detected. Therefore, it is preferable to mount an ion beam irradiation device for cleaning the sample surface in the same sample chamber as in the SEM, and to irradiate the sample surface with an ion beam to perform surface cleaning immediately before the Auger electrons are detected. As an example of a configuration of the ion beam device, a configuration is considered in which the same region on the sample can be irradiated with an ion beam and an electron beam such as an FIB-SEM in which a focused ion beam device and an SEM are combined. In addition, a device configuration may be adopted in which the ion beam device is mounted in another vacuum chamber different from the sample chamber in the SEM.

FIG. 13 illustrates an example of a user interface provided in the electron microscope 1 according to the embodiment 2. A screen I1 (upper left) corresponds to an element selection screen, a screen I2 (upper right) corresponds to a display screen displaying measurement conditions and an SEM image, and a screen I3 (lower) corresponds to a display screen displaying a spectrum and mapping images. When a material composition of the sample is known, an element to be analyzed is selected from a table in I1. A field of view or a region to be analyzed is specified from the SEM image displayed in I2. It is also possible to analyze a point such as a point A or a point B indicated by a mark (x) in I2. An analysis result is displayed in I3. By enabling an energy value, which is calculated by the TOF detection using a standard sample for calibration, to be calibrated, analysis accuracy can be improved. By using analysis functions described above, it is possible to perform foreign matter inspection or a local analysis on an oxidation state distribution of the sample.

In FIG. 13, a surface voltage distribution of the sample described in the embodiment 1 may be presented. For example, when a tab for displaying the surface voltage is disposed in an upper part of FIG. 13 and a user selects the tab, the surface voltage distribution as described with reference to FIGS. 11A to 11C is displayed.

Embodiment 3

Figure 14A:
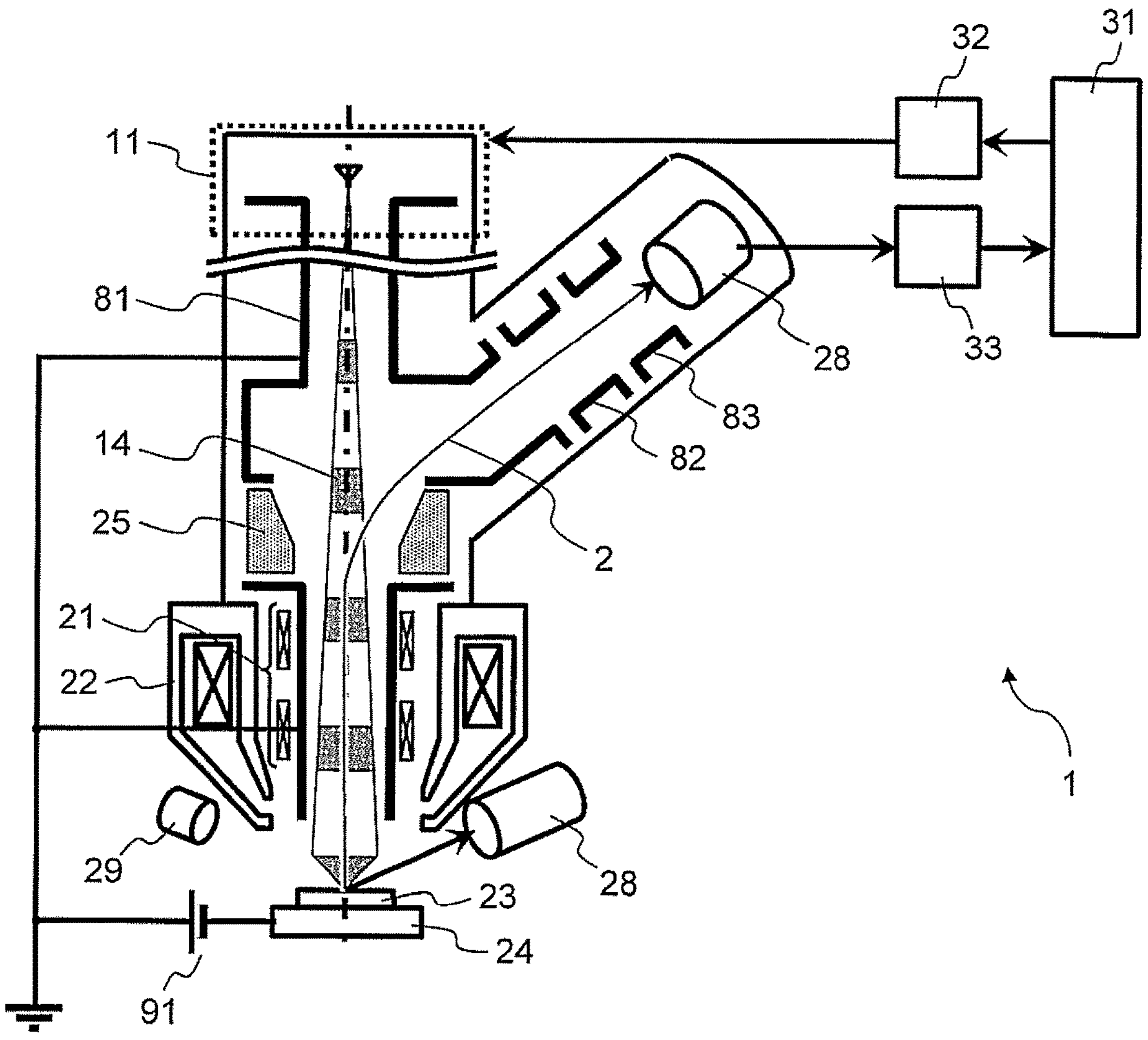
FIG. 14A is a configuration view of the electron microscope 1 according to an embodiment 3.
Figure 14B:
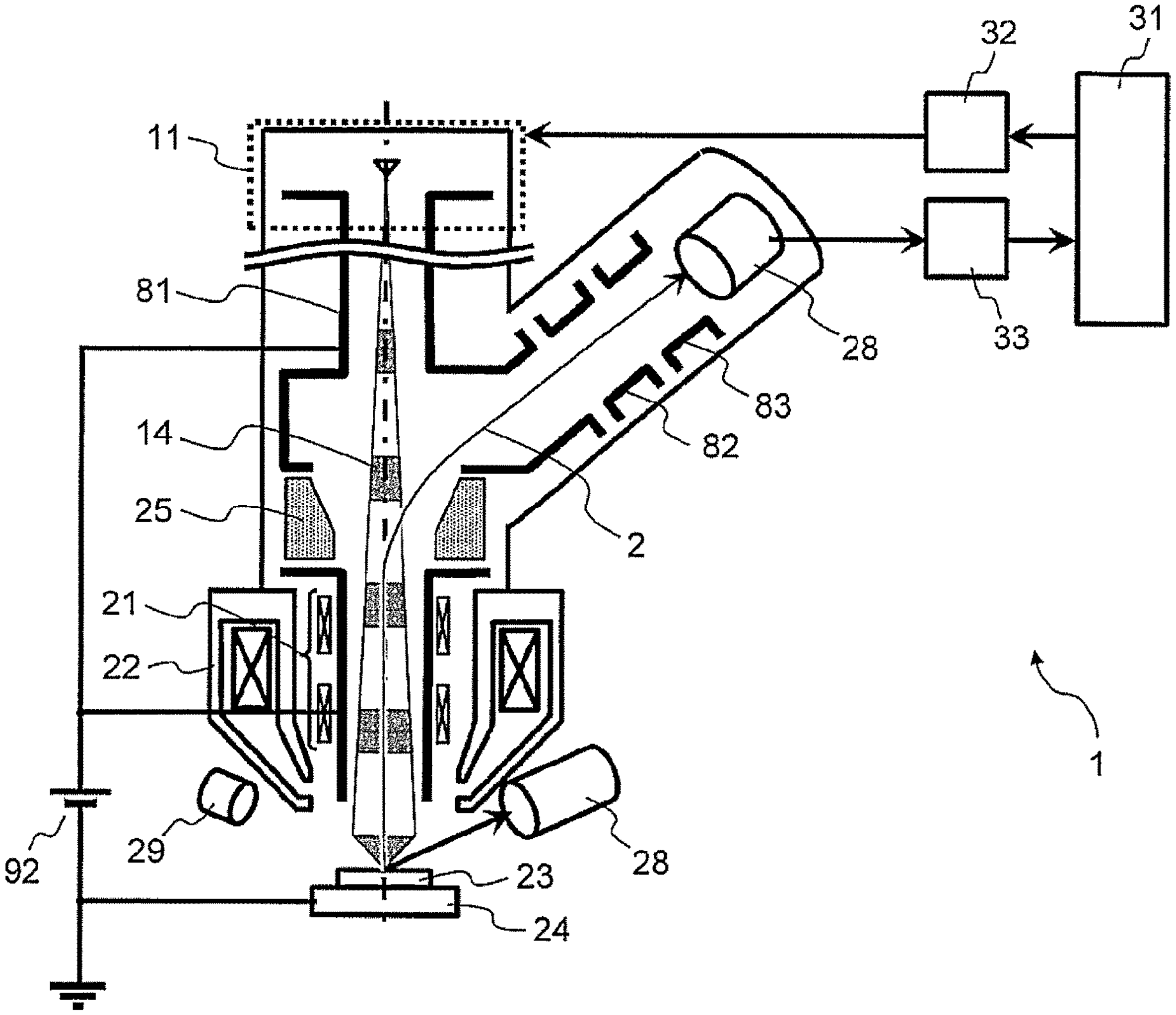
FIG. 14B is a configuration view of the electron microscope 1 according to the embodiment 3.

FIGS. 14A and 14B are configuration views of the electron microscope 1 according to an embodiment 3 of the invention. In the embodiment 3, a configuration example will be described in which a TOF detection technique according to the invention is applied to an SEM to which a retarding method or a boosting method is applied. Configurations of the pulse electron gun 11 and the detector 28 are the same as those in the embodiment 1. A configuration different from the embodiment 1 will be described in detail below.

In order to reduce an adverse influence caused by top surface observation, charging, damage, or the like of the sample 23, SEM observation is performed by emitting the irradiation electron beam 14 with low irradiation energy. In order to obtain a high spatial resolution in the SEM observation with low irradiation energy, an observation method of distributing a deceleration electric field for the irradiation electron beam 14 between the sample and the objective lens 22 is used. This method substantially forms an electric field lens between the sample and the objective lens 22 to shorten a focal point of the objective lens 22, and is called the retarding method or the boosting method depending on a manner of an electrode voltage.

When the electric field is distributed in which the irradiation electron beam 14 is decelerated for irradiation, the signal electrons generated on the sample are accelerated by this electric field. As can be seen from Formula 1 described in the embodiment 1, since a time difference in TOF of the signal electrons is decreased in an acceleration region, a detector configuration different from a case in which acceleration and deceleration are not performed is required.

A method for performing TOF detection on SE when a negative voltage of 1 kV is applied to the sample in the device configuration in FIG. 14A will be described. Components other than the sample will be described as a ground potential unless otherwise specified. Signal electrons having $E_0$=1 eV, 10 eV, and 100 eV on the sample are considered. According to Formula 1, energy of each electron in a space of a ground potential after passing through the objective lens 22 is E=1001 eV, 1010 eV, and 1100 eV. When each electron is accelerated to about 1 keV immediately after being emitted from the sample, a TOF of each electron after traveling 100 mm is 5.33 ns, 5.31 ns, and 5.08 ns. Since a time difference in TOF of electrons accelerated in this manner is as small as 0.1 ns or less, it is difficult to identify a difference in energy by circuit techniques in the related art. In order to avoid this problem, a method of guiding the signal electrons 2 accelerated once to a deceleration space and performing the TOF detection by a detection system set in a manner that the time difference in TOF can be formed in this deceleration space is effective.

The signal electrons off-axis using the beam separator 25 are guided to a beam tube 82 and a beam tube 83 and decelerated. When the signal electrons inside the beam tubes are decelerated, if a potential difference is provided such that the energy of the electrons rapidly decreases, the signal electrons are subjected to a strong convergence effect and a trajectory of the signal electrons diverges after convergence, which makes it difficult to perform highly efficient detection. Therefore, when the signal electrons are decelerated, it is preferable to adopt a configuration in which the deceleration is divided into several stages and the signal electrons are guided to the detector while being slowly decelerated. FIG. 14A illustrates a configuration example when the beam tube 82 and the beam tube 83 are provided and the deceleration is divided into two stages.

A negative voltage is applied to each beam tube and SE accelerated to 1 keV or more is decelerated. A voltage value applied to each beam tube for appropriately controlling a trajectory of SE depends on dimensions of electrodes. For example, when −0.5 kV is applied to the beam tube 82 and −0.9 kV is applied to the beam tube 83, energy of SE in the beam tube 82 is about 500 eV and energy of SE in the beam tube 83 is about 100 eV. In this case, the same voltage as that of the nearest disposed beam tube is set on the guard electrode 51 of the detector 28. In this manner, energy discrimination detection can be performed by creating a sufficient time difference in TOF in the beam tube 83.

Since the beam tube serving as the deceleration space is a substantial TOF space, an energy resolution is determined by a degree of deceleration and a length of the beam tube serving as the deceleration space. For example, a case is considered in which, SE having energy of 1 eV and SE having energy of 10 eV on the sample are accelerated by a retarding electric field in the TOF space and then are decelerated to have deceleration energy of 100 eV, and TOF measurement is performed in a space with L=1000 mm. At this time, TOF of an electron of 1 eV is 168 ns, and TOF of an electron of 10 eV is 161 ns. When a pulse waveform can be analyzed with a temporal resolution of about 1 ns, an energy value can be sufficiently analyzed. Preferable numerical values are set for a pulse width and a pulse interval according to a detection behavior of TOF in the deceleration space.

FIG. 14A illustrates a case of applying the retarding method, and the same also applies to a case of applying the boosting method. A device configuration during boosting is illustrated in FIG. 14B. A polarity of an applied voltage is different from that of an electrode to which the voltage is applied during retarding and boosting. When the sample 23 is in contact with the ground, a positive voltage is applied to a boosting electrode 81 to accelerate the irradiation electron beam and the signal electrons.

Embodiment 4

In an embodiment 4 of the invention, an example will be described in which the TOF detection on SE described in the embodiments 1 to 3 is applied to measurement of a metal corrosion process. The process in which a metal corrodes (rusts) is caused by oxidation of atoms constituting a metal material at an interface between the metal and water. Since electric field concentration occurs locally in a portion in which a redox reaction occurs, a progress state of corrosion can be measured by observing a local potential distribution using the SEM including the TOF detection system described in the embodiments 1 to 3 at an interface between the metal and liquid (or a solvent).

Figure 15A:
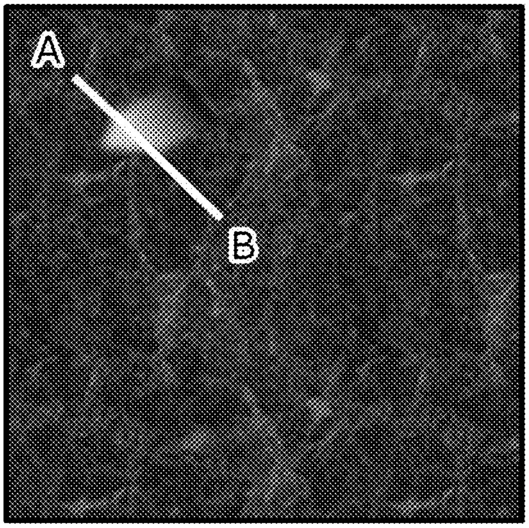
FIG. 15A illustrates an example of a shape image when a metal surface is observed.

FIG. 15A illustrates an example of a shape image when a metal surface is observed using the above method. A white region different from a peripheral composition is observed in the middle of a line segment AB. It can be considered that this region may be corroded.

Figure 15B:
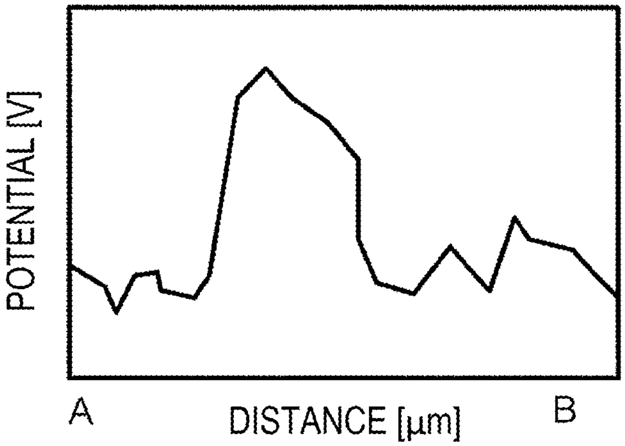
FIG. 15B illustrates a measurement example of a potential profile along a line segment AB in FIG. 15A.

FIG. 15B illustrates a measurement example of a potential profile along the line segment AB in FIG. 15A. It can be seen that a potential of a portion corresponding to the white region in FIG. 15A is higher than a peripheral potential. Accordingly, it can be estimated that this portion may be corroded. The control unit 31 (arithmetic unit) can estimate the progress state of corrosion at this portion by specifying the portion having a high potential. For example, a corrosion progress degree can be estimated according to how much higher the potential of this portion is compared to the potential of a peripheral portion.

Modifications of Invention

The invention is not limited to the above-described embodiments and includes various modifications. For example, the embodiments described above have been described in detail for easy understanding of the invention, and the invention is not necessarily limited to those including all the configurations described above. A part of a configuration according to one embodiment can be replaced with a configuration according to another embodiment, and a configuration according to one embodiment can be added to a configuration according to another embodiment. A part of a configuration according to each embodiment may be added, deleted, or replaced with another configuration.

In the above embodiments, the interface (for example, an interface described in FIG. 13) provided in the electron microscope 1 can be implemented by, for example, the control unit 31 displaying the interface on a screen of a display.

In the above embodiments, the control unit 31, the TOF arithmetic unit 32, and the energy spectrum arithmetic unit 33 may be implemented by hardware such as a circuit device having these functions, or may also be implemented by an arithmetic device such as a central processing unit (CPU) executing software having these functions. All or a part of these functional units may be integrated. For example, a process (an operation as an arithmetic unit) of calculating the surface voltage of the sample may be performed by any of these functional units. The same also applies to other arithmetic operations.

REFERENCE SIGNS LIST

1: electron microscope
11: pulse electron gun
14: irradiation electron beam
21: deflector
22: objective lens
23: sample
24: sample stage
25: beam separator
26: deflection electrode
27: counter electrode
28: detector
29: detector
31: control unit
32: TOF arithmetic unit
33: energy spectrum arithmetic unit
41: pulse light source
42: excitation light
43: viewport
44: optical lens
45: substrate
46: active layer
47: extraction electrode
48: cathode voltage
51: guard electrode
52: scintillator
53: light guide
54: photomultiplier tube
55: amplifier
56: detector voltage
61: pulse width
62: pulse interval
71: detector
72: detector
81: boosting electrode
82: beam tube
83: beam tube
91: retarding voltage
92: boosting voltage

The invention claimed is:

1. An electron microscope for observing a sample by irradiating the sample with an electron beam, the electron microscope comprising:

a pulsed electron emission mechanism configured to emit the electron beam in a pulsed manner;

a detector configured to detect signal electrons emitted from the sample by irradiating the sample with the pulsed electron beam;

a timing control unit configured to control a sampling timing of a detection signal output from the detector while controlling an irradiation parameter of the pulsed electron beam;

a time-of-flight calculation unit configured to discriminate the signal electrons according to a time of flight; and an arithmetic unit configured to calculate a surface voltage of the sample by comparing an energy spectrum of the signal electrons detected by the detector with an energy spectrum of the signal electrons when a charging amount of the sample is equal to or less than a reference value, wherein the timing control unit controls the pulsed electron emission mechanism to emit the electron beam with a pulse width equal to or less than the time of flight of the signal electrons, which is derived from a flight distance of the signal electrons and energy of the signal electrons.

2. The electron microscope according to claim 1, wherein the timing control unit controls the sampling timing to start sampling of the detection signal at a timing after a time required for the signal electrons to reach the detector from emission of the electron beam by the pulsed electron emission mechanism.

3. The electron microscope according to claim 1, wherein the timing control unit controls the sampling timing to complete sampling of the detection signal generated by a first electron beam in a period from emission of the first electron beam by the pulsed electron emission mechanism to emission of a subsequent second electron beam by the pulsed electron emission mechanism.

4. The electron microscope according to claim 1, wherein the timing control unit controls the sampling timing to start, after the pulsed electron emission mechanism emits the electron beam, sampling of the detection signal from a time point at which the detector initially detects the signal electrons.

5. The electron microscope according to claim 1, further comprising:

an interface configured to output a two-dimensional distribution of the surface voltage of the sample.

6. The electron microscope according to claim 1, further comprising:

an objective lens configured to irradiate the sample with the electron beam, wherein the detector is disposed between the pulsed electron emission mechanism and the objective lens, the electron microscope further comprising:

a beam separator configured to deflect the signal electrons toward the detector, wherein the pulsed electron emission mechanism includes a light source and a photocathode configured to emit electrons by excitation light from the light source.

7. The electron microscope according to claim 1, wherein the pulsed electron emission mechanism is configured to emit the electron beam with a pulse width of 1 ns or less, wherein the time-of-flight calculation unit discriminates the signal electrons having energy of 10 eV or less, and wherein the arithmetic unit calculates the surface voltage of the sample using a result obtained by the detector detecting the signal electrons, which have energy of 10 eV or less and are discriminated by the time-of-flight calculation unit.

8. The electron microscope according to claim 1, further comprising:

an objective lens configured to irradiate the sample with the electron beam, wherein the detector is disposed between a stage on which the sample is placed and the objective lens, and the time-of-flight calculation unit identifies an element of the sample at a position irradiated with the electron beam using the time of flight or the energy of the signal electrons.

9. The electron microscope according to claim 8, further comprising:

an interface configured to present the identified element of the sample.

10. The electron microscope according to claim 1, further comprising:

an objective lens configured to irradiate the sample with the electron beam;

a separator configured to deflect the signal electrons toward the detector; and a decelerator configured to decelerate the signal electrons before the signal electrons reach the detector, wherein an electric field for accelerating the signal electrons is formed between the sample and the objective lens.

11. The electron microscope according to claim 10, wherein the pulsed electron emission mechanism emits the electron beam with a pulse width smaller than a difference between a time of flight during which the signal electrons having energy of 10 eV fly from the sample to the detector and a time of flight during which the signal electrons having energy of 1 eV fly from the sample to the detector.

12. The electron microscope according to claim 1, wherein the arithmetic unit generates an observation image of the sample using the signal electrons, and wherein the arithmetic unit measures a progress state of corrosion of the sample by comparing a surface shape of the sample obtained based on the observation image with the surface voltage of the sample.

* * * * *